(12) United States Patent
Kim et al.

(10) Patent No.: US 9,030,092 B2
(45) Date of Patent: May 12, 2015

(54) SILICON OXYNITRIDE PHOSPHORE, PRODUCTION METHOD FOR SAME, AND OPTICAL ELEMENT COMPRISING SAME

(71) Applicant: Kyounggi University Industry & Academia Cooperation Foundation, Gyeonggi-do (KR)

(72) Inventors: Young Jin Kim, Seoul (KR); Seung Jae Lee, Gyeonggi-do (KR)

(73) Assignee: Kyounggi University Industry & Academia Cooperation Foundation, Gyeonggi-do (KR)

( * ) Notice: Subject to any disclaimer, the term of this patent is extended or adjusted under 35 U.S.C. 154(b) by 0 days.

(21) Appl. No.: 14/380,986

(22) PCT Filed: Feb. 27, 2013

(86) PCT No.: PCT/KR2013/001608
§ 371 (c)(1),
(2) Date: Aug. 26, 2014

(87) PCT Pub. No.: WO2013/129854
PCT Pub. Date: Sep. 6, 2013

(65) Prior Publication Data
US 2015/0015136 A1    Jan. 15, 2015

(30) Foreign Application Priority Data

Feb. 27, 2012  (KR) .................. 10-2012-0019646
Feb. 27, 2013  (KR) .................. 10-2013-0021608

(51) Int. Cl.
*H05B 33/00*   (2006.01)
*F21K 99/00*   (2010.01)
(Continued)

(52) U.S. Cl.
CPC ............... F21K 9/56 (2013.01); C09K 11/7734 (2013.01); *F21Y 2101/02* (2013.01)

(58) Field of Classification Search
CPC ...... H05B 33/14; H05B 33/22; H01L 33/502; C09K 11/7734; Y02B 20/181
USPC .................................. 313/503; 428/690, 977
See application file for complete search history.

(56) References Cited

U.S. PATENT DOCUMENTS 7,965,031 B2   6/2011   Brunner et al.
8,057,704 B2   11/2011  Xie et al.
(Continued)

FOREIGN PATENT DOCUMENTS

JP    2008-045080   9/2010
JP    2008-016861   2/2011
(Continued)

OTHER PUBLICATIONS

International Search Report mailed Jun. 24, 20123 for PCT/KR2013/001608.
(Continued)

*Primary Examiner* — Joseph L Williams (57) ABSTRACT

The present invention relates to a silicon oxynitride phosphor, a production method for same, and an optical element comprising same. According to one embodiment of the present invention, the silicon oxynitride phosphor is a silicon oxynitride phosphor comprising a compound represented by the following chemical formula 1, which emits light on being irradiated by means of a light source. Chemical formula 1: $Sr_{2-z}Si(O_{1-x}N_x)_4:zEu^{2+}$, where $0<x<1$ and $0<z\leq0.4$.

23 Claims, 6 Drawing Sheets

(51) Int. Cl.
  *C09K 11/77* (2006.01)
  *F21Y 101/02* (2006.01)

(56) References Cited

U.S. PATENT DOCUMENTS

| 8,550,645 | B2 | 10/2013 | Miki et al. |
| 2005/0156496 | A1 | 7/2005 | Takashima et al. |

FOREIGN PATENT DOCUMENTS

| KR | 10-2007-0003377 | 1/2007 |
| KR | 10-0684043 | 2/2007 |
| KR | 10-2009-0019677 | 2/2009 |
| KR | 10-2011-0084270 | 7/2011 |

OTHER PUBLICATIONS

Written Opinion of the International Search Report mailed Jun. 24, 2013 for PCT/KR2013/001608.

SILICON OXYNITRIDE PHOSPHORE, PRODUCTION METHOD FOR SAME, AND OPTICAL ELEMENT COMPRISING SAME

This application claims the priority of Korean Patent Application Nos. 10-2012-0019646 and 10-2013-0021608, filed on Feb. 27, 2012 and Feb. 27, 2013 in the KIPO (Korean Intellectual Property Office), the disclosure of which is incorporated herein entirely by reference. Further, this application is the National Stage application of International Application No. PCT/KR2013/001608, filed Feb. 27, 2013, which designates the United States and was published in Korean. Each of these applications is hereby incorporated by reference in their entirety into the present application.

TECHNICAL FIELD

The present invention relates to a phosphor based on a silicon compound, and more particularly, a silicon oxynitride phosphor, a method of fabricating the same, and an optical device including the same.

BACKGROUND ART

Recently, researches are being widely made on illumination devices or image display devices using solid-state luminescent devices, such as semiconductor light-emitting diodes. From among such illumination devices, a white light-emitting diode (LED) lamp emits light as electrons and holes are combined with each other and is being spotlighted as a next generation highly-efficient illumination device to replace incandescent lamps and fluorescent lamps in the prior art. Advantages of the white LED include reduced energy consumption due to its efficiency, exclusion of materials with high environment burdens, such as mercury, miniaturization of lamps for installation in a narrow space, high vibration resistance, and long lifespan. Therefore, a white LED may be applied to various purposes.

A white LED lamp in the prior art includes a LED device emitting a blue short wavelength light and a phosphor which emits a yellow long wavelength light by being excited by absorbing the blue short wavelength light partially or entirely. In this case, white light is obtained as a blue light emitted by the blue LED and a yellow light emitted by the excited phosphor are mixed. An example of yellow light emitting phosphors in the prior art is a garnet-based phosphor consisting of cerium-activated yttrium and aluminum. In this case, white light may be obtained by mixing a blue light emitted by a blue LED chip around 450 nm and a yellow light emitted by a yellow phosphor around 560 nm. However, a white light obtained as described above includes insufficient red component, and thus it is difficult to improve color rendition. Furthermore, due to the lack of red component, it is difficult to obtain a white illumination device having a sufficiently low color temperature similar to that of a light bulb.

To obtain an illumination device with improved color rendition and a low color temperature, a yellow phosphor may be mixed with a small amount of red phosphor, or a green phosphor and a red phosphor may be used instead of a yellow phosphor. In this case, it is necessary to develop a red phosphor with excellent color purity. However, since a red phosphor normally has a relatively low excitation spectrum in ultraviolet ray region or blue region, the red phosphor features lower efficiency than a green phosphor or a blue phosphor. Furthermore, it is necessary to mix a red phosphor in an entire phosphor at a relatively large ratio (60 wt % or above). Furthermore, to guarantee long lifespan and high output power to an illumination device and a display device, a red phosphor needs to have excellent temperature stability.

DISCLOSURE OF THE INVENTION

Technical Problem

The present invention provides silicon oxynitride phosphor including a red light emitting phosphor, which provides a red light with high purity and high brightness for improved color rendition, high light-emitting efficiency, and excellent temperature stability.

The present invention provides a method of fabricating a silicon oxynitride phosphor having the above-stated advantages.

The present invention provides various optical devices using the silicon oxynitride phosphor.

Technical Solution

According to an aspect of the present invention, there is provided a silicon oxynitride phosphor including a compound indicated by Formula 1 below.

$$Sr_{2-z}Si(O_{1-x}N_x)_4{:}zEu^{2+}, \qquad [\text{Formula 1}]$$

wherein $0<x<1$ and $0<z\leq 0.4$, wherein a light is irradiated to the silicon oxynitride phosphor, and the silicon oxynitride phosphors emits light.

According to another aspect of the present invention, there is provided a silicon oxynitride phosphor including a compound indicated by Formula 2 below.

$$Sr_{2-y-z}M_ySi(O_{1-x}N_x)_4{:}zEu^{2+}, \qquad [\text{Formula 2}]$$

wherein M is Ca, Ba, Mg, or a combination thereof, wherein $0<x<1$, $0<y<2$, $0<z\leq 0.4$, $0<y+z<2$, a light is irradiated to the silicon oxynitride phosphor, and the silicon oxynitride phosphors emits light.

According to another aspect of the present invention, there is provided a method of fabricating a silicon oxynitride phosphor including mixing precursor compositions indicated by chemical formulae $SrCO_3$, $Si_3N_4$, and $Eu_2O_3$; and forming a compound indicated by Formula 1 by thermally treating the mixture.

According to another aspect of the present invention, there is provided a method of fabricating a silicon oxynitride phosphor including mixing precursor compositions indicated by chemical formulae $SrCO_3$, $Si_3N_4$, and $Eu_2O_3$ with an oxide, a nitride, a oxynitride, a carbonate, a hydroxide, or a chloride of a metal M; and forming a compound indicated by Formula 2 by thermally treating the mixture.

According to another aspect of the present invention, there is provided an optical device including an excitation light source, which emits a light in at least one from among near-ultraviolet ray region, ultraviolet ray region, and blue region; and a phosphor of any of claims 1 through 13, which is arranged at an optical path of the excitation light source, is excited by the light, and emits a light.

Advantageous Effects

According to embodiments of the present invention, a silicon oxynitride phosphor capable of improving color rendition by providing a red light with high purity and high intensity and having a wide light-emission band from blue region to red region, from blue region to green region, or from green region to red region based on a selection of an excitation light source from among ultraviolet ray, near-ultraviolet ray, and blue visible ray may be provided. Furthermore, according to embodiments of the present invention, a red light-emission phosphor capable of controlling location and intensity of main light-emission wavelength in red region may be provided.

Furthermore, according to embodiments of the present invention, a method of reliably fabricating a red light-emission phosphor having the above-stated advantages is provided. Furthermore, white color is embodied by mixing red illumination using the red light-emission phosphor, a part of a light emitted by an arbitrary light source, and a wavelength-converted light excited by the same. Therefore, white illumination with excellent color rendition may be provided.

MODE FOR CARRYING OUT THE INVENTION

The present invention will now be described more fully with reference to the accompanying drawings, in which exemplary embodiments of the invention are shown.

The invention may, however, be embodied in many different forms and should not be construed as being limited to the embodiments set forth herein; rather these embodiments are provided so that this disclosure will be thorough and complete, and will fully convey the concept of the invention to one of ordinary skill in the art. Meanwhile, the terminology used herein is for the purpose of describing particular embodiments only and is not intended to be limiting of exemplary embodiments.

Also, thickness or sizes of layers in the drawings are exaggerated for convenience of explanation and clarity, and the same reference numerals denote the same elements in the drawings. As used herein, the term "and/or" includes any and all combinations of one or more of the associated listed items.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising" used herein specify the presence of stated features, integers, steps, operations, members, components, and/or groups thereof, but do not preclude the presence or addition of one or more other features, integers, steps, operations, members, components, and/or groups thereof.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

From among light-emitting regions throughout the present specification, regions from a blue region to a green region correspond to regions having wavelengths from about 440 nm to about 580 nm, regions from the green region to a red region correspond to regions having wavelengths from about 490 nm to about 750 nm, and regions from the blue region to the red region correspond to regions having wavelengths from about 440 nm to about 750 nm The present application is based on the report "Synthesis and Luminescent Properties of (Sr, M) $2Si(O_{1-x}N_x)_4:Eu^{2+}$ (M: $Mg^{2+}$, $Ca^{2+}$, $Ba^{2+}$)," written by the present inventor and published on Journal of The Electrochemical Society, Vol. 159(5), from pp. J163 to J167, where the report is included in the present specification as a reference and shall be considered as a part of the present specification.

A silicon oxynitride phosphors according to embodiments of the present invention is a nonstoichiometric solid solution, expressed as shown in Formulas below. Hereinafter, a compound expressed by Formula 1 below will be referred to as a SSON compound.

[Formula 1]

$Sr_{2-z}Si(O_{1-x}N_x)_4:zEu^{2+}$, wherein 0<x<1 and 0<z≤0.4.

A silicon oxynitride phosphor according to another embodiment of the present invention may include a compound expressed by Formula 2 below, which is formed by substituting a part of or all of Sr of the above-stated phosphor compound with an alkali metal, e.g., Ca, Ba, and Mg.

$$Sr_{2-y-z}M_ySi(O_{1-x}N_x)_4:zEu^{2+},$$ [Formula 2]

where M is one from among Ca, Ba, and Mg or a combination thereof, wherein $0<x<1$, $0<y<2$, $0<z\le 0.4$, and $0<y+z<2$.

Hereinafter, throughout the present specification, $Sr_{2-y}Ca_ySi_2(O_{1-x}N_x)_4:Eu^{2+}$ will be referred to as a SCSON compound if M is Ca, $Sr_{2-y}Ba_ySi_2(O_{1-x}N_x)_4:Eu^{2+}$ will be referred to as a SBSON compound if M is Ba, and $Sr_{2-y}Mg_ySi_2(O_{1-x}N_x)_4:Eu^{2+}$ will be referred to as a SMSON compound if M is Mg.

The excitation light source may have wavelengths corresponding to the ultraviolet ray region from about 300 nm to about 330 nm, the near-ultraviolet ray region from about 370 nm to about 410 nm, and the blue visible ray region from about 450 nm to about 470 n. In the below embodiments, the wavelengths 320 nm, 377 nm, and 466 nm corresponding to the respective regions are merely examples, and the present invention is not limited thereto. In other words, light-emission characteristics due to excitation wavelength of 320 nm represents light-emission characteristics obtained based on other wavelengths of the ultraviolet ray region, and thus it should be understood that not only the exemplified wavelengths, but also all of the wavelength regions stated herein are within the scope of the present invention.

Hereinafter, features and advantages of the present invention will be disclosed with reference to results of analyzing samples fabricated according to embodiments of the present invention.

A SSON compound, a SCSON compound, a SBSON compound, and a SMSON compound according to an embodiment of the present invention may be easily fabricated via a solid-state process for mixing solid-state raw materials and thermally treating the mixture at a high temperature for a long period of time. Precursors of the respective atoms included in Formula 1 are prepared via the solid-state process. The precursors may be carbonates, nitrides, hydroxides, or chlorides of the respective atoms. Preferably, the precursors may include carbonate of Sr, nitride of Si, and oxide of Eu. For example, the carbonate of Sr may be $SrCO_3$, the nitride of Si may be $Si_3N_4$, and the oxide of Eu may be $Eu_2O_3$. The precursors may be provided in the form of powders. It is confirmed that no stable phase is formed, if $SiO_2$ is used as a precursor of Si for forming silicate as parents. However, if $Si_3N_4$ is used as a precursor of Si as in the current embodiment, stable crystal phase of silicon oxynitride is formed.

In the prior art, metal oxides are generally used for fabricating phosphor nitrides. However, in the present invention, in-process materials are fabricated by using only carbonate and nitride of Sr and Si as precursors of Sr and Si and a silicon oxynitride phosphor is formed at a nitrification via thermal treatment, thereby forming a phosphor having stable phase. The thermal treatment may be performed for a period of time from about 30 minutes to about 20 hours in a reducing atmosphere, e.g., nitrogen atmosphere, where light-emission characteristics of a red phosphor may be adjusted by controlling nitrogen reduction via change of thermal treatment temperature. Selectively, to remove impurities included in the in-process material, such as moisture, organic materials, or complex compounds of some salts and to accelerate growth of crystals, the mixture power may be baked at a relatively low temperature, e.g., from about 500° C. to about 1,000°, for a period of time from about 1 hour to about 10 hours, before the sintering process. The baking operation may be also performed in a reducing atmosphere.

A sinter obtained via the thermal treatment may be crushed to powders and washed if necessary. Accordingly, as described below, the compounds may have β phase, α' phase, or a combination thereof.

According to another embodiment of the present invention, to fabricate the compound of Formula 2 above, the red light-emitting phosphor may be fabricated by using a precursor of an alkali metal, such as Ca, Ba, or Mg, with or without the precursor of Sr. The precursor of each of the respective alkali metals may be a carbonate, a nitride, a hydroxide, or a chloride of a corresponding atom. Unlike the precursor of Si, oxides of such metals, e.g., MgO, may be used as a precursor. In the same regard, light-emission characteristics may be controlled by controlling temperature for a thermal treatment in a reducing atmosphere.

Although the above-stated embodiments relate to a solid-state process, it is merely an example, and the present invention is not limited thereto. It would be obvious to one of ordinary skill in the art that a red light-emitting phosphor according to the present embodiment may be fabricated via a liquid-state process or a gas-state process known in the art.

Figure 1:
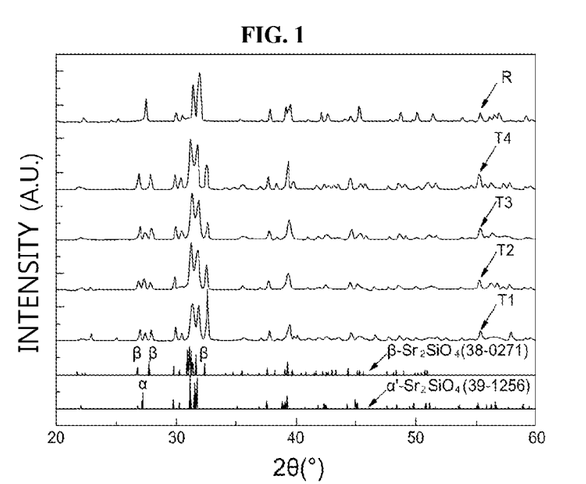
FIG. 1 is a graph showing a result of an X-ray diffraction analysis regarding $Sr_2SiO_4:Eu^{2+}$ in a case where temperatures for thermally treating a SSON compound are 1,400° C., 1,500° C., 1600° C., and 1700° C., according to a first embodiment of the present invention.

FIG. 1 is a graph showing a result of an X-ray diffraction analysis regarding $Sr_2SiO_4:Eu^{2+}$ (curve R) in a case where temperatures for thermally treating a SSON compound are 1,400° C. (curve T1), 1,500° C. (curve T2), 1600° C. (curve T3), and 1700° C. (curve T4), according to a first embodiment of the present invention. Furthermore, FIG. 1 also shows results of X-ray diffraction analysis regarding $β-Sr_2SiO_4$ (#38-0271) and $α'-Sr_2SiO_4$ (#39-1256) on the JCPDS (Joint Committee on Power Diffraction Standards) card.

Referring to FIG. 1, if temperatures for thermally treating a SSON compound are 1,400° C., 1,500° C., and 1600° C. (curves T1, T2, and T3) according to an embodiment of the present invention, the SSON compound exhibits a diffraction pattern almost identical to that of a combination of the $β-Sr_2SiO_4$ (#38-0271) and the $α'-Sr_2SiO_4$ (#39-1256). However, if temperature for thermally treating a SSON compound is 1,700° C. (curve T4), the SSON compound exhibits a diffraction pattern identical to that of the $β-Sr_2SiO_4$ (#38-0271). Furthermore, as a comparative example, $Sr_2SiO_4:Eu^{2+}$ (curve R, referred to hereinafter as SSO) is also analyzed, and it exhibits phase of the $α'-Sr_2SiO_4$ (#39-1256). Therefore, the SSON compound according to the first embodiment of the present invention, which is thermally treated in a temperature range from about 1,300° C. to about 1,650° C. including the temperatures 1,400° C., 1,500° C., and 1,600° C., includes a phase, which is a mixture of phases having crystalline structures of silicate-based phosphors $β-Sr_2SiO_4$ (#38-0271) and $α'-Sr_2SiO_4$ (#39-1256).

Furthermore, the SSON compound according to the first embodiment of the present invention, which is thermally treated in a temperature range from about 1,650° C. to about 1,880° C. including the temperature 1,700° C., includes a single phase having the crystalline structure of $β-Sr_2SiO_4$ (#38-0271). When a thermal treatment temperature increases, a phase transition occurs from (α'+β)-SSON (the curves T1 through T3) to β-SSON (the curve T4), possibly because, since a phase transition may easily occur between the phase α' and the phase β as a displacive transition without breaking major bonding between atoms. Therefore, the phase transition is very sensitive to thermodynamic conditions including temperatures.

Locations of all of XRD peaks of the SSON compound according to the first embodiment of the present invention are different from those of peaks of $Sr_2SiO_4$ crystalline structure in JCRD. It means that oxygen in α'- or $β-Sr_2SiO_4$ is partially substituted by nitrogen, thereby forming a substituted solid solution $Sr_2Si(O_{1-x}N_x)_4$ using $Si_3N_4$ instead of $SiO_2$. Hereinafter, nitrido-silicates according to the first embodiment of the present invention having completely different light-emission characteristics from that of $Sr_2SiO_4:Eu^{2+}$ despite of similar crystalline structure characteristics will be described.

Figure 2:
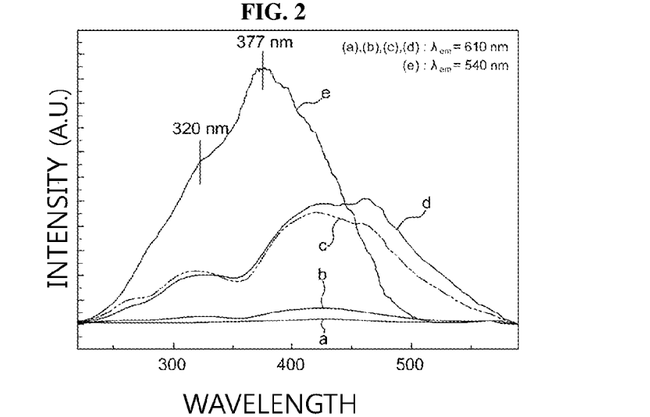
FIG. 2 shows photoluminescence excitation (PLE) spectrums of $Sr_2SiO_4:Eu^{2+}$ in cases where a SSON compound according to the first embodiment of the present invention is thermally treated at 1,400° C., 1,500° C., 1,600° C., and 1,700° C., respectively.

FIG. 2 shows photoluminescence excitation (PLE) spectrums of $Sr_2SiO_4:Eu^{2+}$ (curve e) in cases where a SSON compound according to the first embodiment of the present invention is thermally treated at 1,400° C. (curve a), 1,500° C. (curve b), 1,600° C. (curve c), and 1,700° C. (curve d), respectively. The PLE spectrums are measured in a range of wavelengths from ultraviolet ray region to visible ray region, that is, from about 200 nm to about 600 nm. At all samples, Eu is added by 0.5 mol % of the overall SSON compound.

Referring to FIG. 2, $Sr_2SiO_4:Eu^{2+}$ (curve e, referred to hereinafter as 'SSO') includes two excitation bands of 320 nm and 377 nm based on two excitation centers including Eu(I) having coordination number of 10 and Eu(II) having coordination number of 9. Excitation intensity of the SSO compound rapidly decreases as wavelengths increases from about 370 nm, e.g., wavelengths equal to or longer than 400 nm. The reason is that a wavelength corresponding to excitation energy of electron pairs of the SSO compound belongs to the ultraviolet ray region.

On the contrary, if temperatures for thermally treating SSON compounds according to the first embodiment of the present invention include temperatures 1,600° C. (curve c) and 1,700° C. (curve d), location of PLE peak at 320 nm is identical to that of the SSO compound. However, at 377 nm, peak is shifted toward red wavelengths. As a result, the SSON compound obtains a wide excitation range and main excitation range from about 400 nm to about 480 nm. Other SSON compounds thermally treated at relatively low temperatures including 1,400° C. and 1,500° C. exhibit similar XRD patterns as compared to those of the SSON compounds indicated by the curves c and d, but exhibits very low PLE intensities. Therefore, at temperatures below 1,550° C., which include 1,400° C. and 1,500° C., heat energy for nitrogen substitution of SSO compound and activation of Eu ions may not be sufficiently supplied.

However, in a SSON compound thermally treated in a temperature range from about 1,550° C. to about 1,800° C., which includes temperatures 1,600° C. and 1,700° C., nitrogen is successfully substituted, thereby exhibiting PLE characteristics clearly distinguishable from that of a SSO compound as shown in FIG. 2. The substituted nitrogen significantly affects light-emission characteristics of Eu(II)-site, but less significantly affects light-emission characteristics of Eu(I)-site. Here, although oxygen coordination number of Eu(II) is 9, oxygen coordination number of Eu(I) is 10. Therefore, since bonding length of Eu(II) is shorter than that of Eu(I), Eu(II) may be more significantly affected by a crystal field induced by the substituted nitrogen. The above-stated characteristics induce red shift of $Eu^{2+}$ ions at the lowest 5d excitation level and broadband of PLE spectrums as described below. Furthermore, as a temperature for thermal treatment increases, PLE strength tends to increase.

According to an embodiment of the present invention, nitrogen ions inserted into crystalline structure of a SSO compound induce large crystal field splitting and nephelauxetic effect (lowers $E_c$; here, $E_c$ denotes centroid energy of 5d excitation level of $Eu^{2+}$ ions) due to covalent bonding of the nitrogen ions, thereby broadbanding PLE spectrums and inducing red shift of $Eu^{2+}$ ions at the lowest 5d excitation level. As described above, according to an embodiment of the present invention, excitation wavelength band of $Sr_2Si(O_{1-x}N_x)_4$, which is obtained by partially substituting oxygen ions with nitrogen ions in Sr2SiO4, is red-shifted, and thus a phosphor having a wide excitation band exhibiting the maximum excitation intensity not only in near-ultraviolet ray region, but also in short-wavelength visible ray region (blue visible ray region) may be provided.

Recently, an InGaN-based diode capable of emitting high-intensity lights in near-ultraviolet ray region and short-wavelength visible ray region is being highlighted. However, due to difficulty of fabrication and expensive raw materials including rare earths, more economic replacement thereof is demanded. A SSON compound according to an embodiment of the present invention may be fabricated by using inexpensive raw materials, and a phosphor exhibiting high absorption intensity in both near-ultraviolet ray region and short-wavelength visible ray region by thermally treating the SSON compound in a temperature range from about 1,550° C. to about 1,800° C., which includes temperatures 1,600° C. and 1,700° C., may be obtained. High absorption intensity of a SSON phosphor may provide a highly efficient optical device capable of emitting high-intensity light.

Table 1 below shows contents of nitrogen and oxygen at sample powders. Referring to Table 1, in a SSO compound according to a comparative embodiment, oxygen content was about 20.6 wt %, where no nitrogen was detected. Considering that a theoretical value obtained via a calculation is 23.9 wt %, the reason of the deviation may be that, since the SSO compound is thermally treated in hydrogen atmosphere, the SSO compound becomes oxygen-deficient with respect to the stoichiometric composition. However, SSON compounds according to an embodiment of the present invention, which are thermally treated at 1,600° C. and 1,700° C., contain nitrogen by about 2.0 wt % and about 1.8 wt %, respectively. Considering measurement error, the contents may be considered as being substantially identical to each other, and broadband of excitation wavelengths and red-shift as described above may occur in a range from about 1 wt % to about 10 wt %, which includes 2.0 wt %. Despite substantially identical nitrogen contents, β-SSON powders exhibit slightly higher PLE strength than (α'+β)-SSON powders.

TABLE 1

| Sample | Nitrogen (wt %) | Oxygen (wt %) | Phase |
|---|---|---|---|
| SSO compound | 0.0 | 20.6 | α'-$Sr_2SiO_4$ |
| SSON compound (1,600° C.) | 2.0 | 18.6 | (α' + β-$Sr_2Si(O_{1-x}N_x)_4$ |
| SSON compound (1,700° C.) | 1.8 | 17.2 | β-$Sr_2Si(O_{1-x}N_x)_4$ |

Figure 3A:
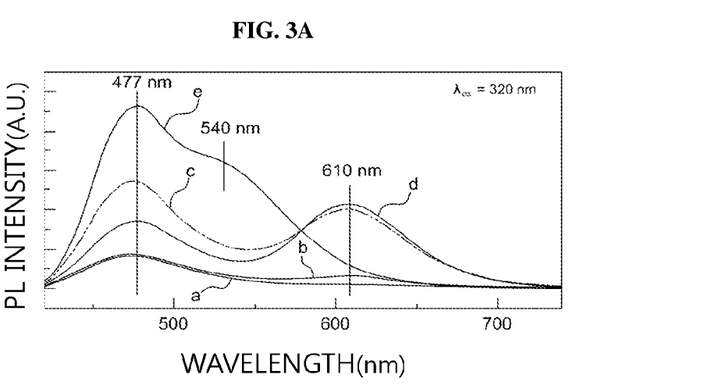
FIGS. 3A through 3C show light-emission spectrums of samples according to embodiments of the present invention and a comparative embodiment, excited by light sources having wavelengths of 320 nm, 377 nm, and 466 nm, respectively.
Figure 3B:
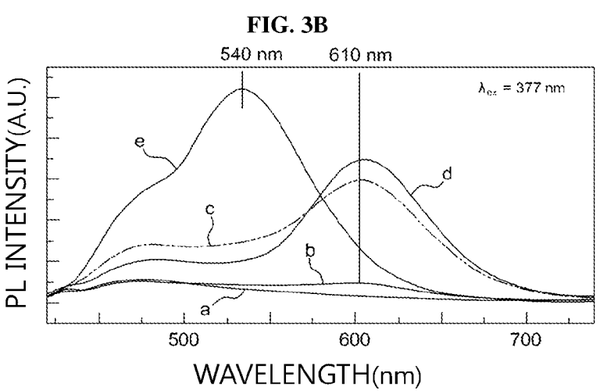
Figure 3C:
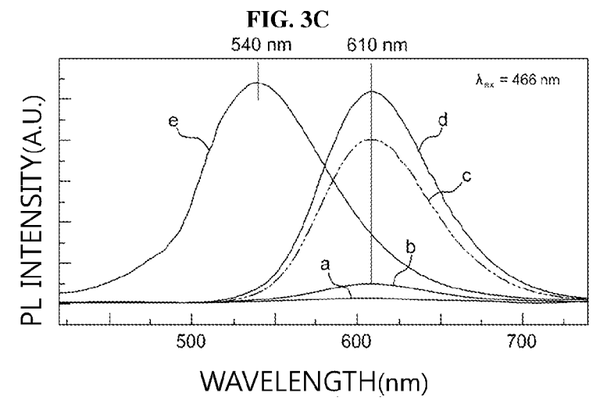

FIGS. 3A through 3C show light-emission spectrums of samples according to embodiments of the present invention and a comparative embodiment, excited by light sources having wavelengths of 320 nm, 377 nm, and 466 nm, respectively.

Referring to FIG. 3A, $Sr_2SiO_4:Eu^{2+}$ (curve e) according to the comparative embodiment may obtain a light-emission spectrum having peaks at 477 nm and 540 nm in yellow visible ray region when excited by a light having 320 nm wavelength. The light-emission peak at 477 nm is based on Eu(I)-site, whereas the light-emission peak at 540 nm is based on Eu(II)-site. In case of excitation based on a light having 320 nm wavelength, both Eu(I) and Eu(II) are excited. However, since Eu(I) is activated more than Eu(II), the peak at 477 nm is greater than the peak at 540 nm.

On the contrary, in case of SSON compounds according to an embodiment of the present invention, which are thermally treated at 1,400° C. (curve a), 1,500° C. (curve b), 1,600° C. (curve c), and 1,700° C. (curve d), a light-emission peak at 477 nm is maintained, but a light-emission peak at 540 nm completely disappears. Instead, in a SSON compound according to an embodiment of the present invention, a new light-emission peak appears at 610 nm, which is a wavelength in red visible ray region, and intensity of the light-emission peak increases as a temperature for thermal treatment increases.

It is clear that transformation of the SSO compound to a SSON compound significantly affects a light-emission peak based on Eu(II)-site is significantly affected, but less significantly affects a light-emission peak based on Eu(I). As a result, when a SSON compound according to an embodiment of the present invention is excited by a light having 320 nm wavelength, the SSON compound exhibits light-emission spectrum 477 nm and a red wavelength due to a large transition in light-emission spectrum from 574 nm to 610 nm, thereby obtaining a broadband PLE spectrum Referring to FIG. 3B, if $Sr_2SiO_4:Eu^{2+}$ (curve e) according to the comparative embodiment is excited by a light having 377 nm wavelength, intensity of light-emission peak at 477 nm decreases, but intensity of light-emission peak at 540 nm becomes larger than the intensity of the light-emission peak at 477 nm, unlike in the case of excitation based on a light having 320 nm wavelength.

However, in a SSON compound according to an embodiment of the present invention, a light-emission peak at 477 nm and a light-emission peak at 610 nm are observed, like in the case of excitation based on a light having 320 nm wavelength. However, intensity of light-emission peak at 477 nm decreases by 50% or more, whereas intensity of light-emission peak at 610 nm may increase by 200% or more. Furthermore, in light-emission spectrum of a SSON compound according to an embodiment of the present invention, no light-emission peak appears at 540 nm as described above.

Referring to FIG. 3C, in case of excitation based on a light having 466 nm wavelength, in $Sr_2SiO_4:Eu^{2+}$ (curve e) according to the comparative embodiment and SSON compounds (curves a through d) according to an embodiment of the present invention, light-emission peaks at 477 nm almost disappear, and main light-emission peaks appear at 540 nm and 610 nm. In the SSON compound, Eu(I) could be excited at an excitation wavelength from about 320 nm to about 377 nm, but even Eu(I) is not excited at the excitation wavelength of 466 nm.

As shown in FIGS. 3A through 3C, according to embodiments of the present invention, SSON compounds (curves a and b) thermally treated at 1,400° C. and 1,500° C. exhibit weak light-emission intensities. However, in case of SSON compounds thermally treated at 1,600° C. (curve c) and 1,700° C. (curve d), light-emission intensity increases as a temperature for thermal treatment increases. Therefore, it is clear that, as nitrogen substitution occurs successfully based on a thermal treatment in a temperature range from about 1,550° C. to about 1,800° C., which includes temperatures 1,600° C. and 1,700° C., a transformation, which significantly affects crystal field, from a SSO compound to a SSON compound occurs.

Furthermore, in a SSON compound according to an embodiment of the present invention, intensity of light-emission peak at 477 nm may be controlled by controlling wavelength range of excitation light. According to an embodiment of the present invention, it is clear that excitation based on a light having 466 nm wavelength exhibits sufficient energy to eliminate Eu(I) contribution. Therefore, in case of a SSON compound, longer wavelength light-emission characteristics may be obtained by using an excitation light in blue region than in case of using an excitation light in ultraviolet ray region. However, if the SSON compound is excited by a near-ultraviolet ray LED emitting a light in a ultraviolet ray region or a near-ultraviolet ray region (preferably, the near-ultraviolet ray region), the SSON compound exhibits light-emission characteristics having wide band from blue region to red region.

Furthermore, in the SSON compound, broadband red spectrum may be obtained by eliminating a light-emission peak at 540 nm and red-shifting significantly to 610 nm. In a general LED illumination device, the most effective light-emission wavelength of a red light-emitting phosphor for improving color rendition index of white light is from about 600 nm to about 630 nm. According to an embodiment of the present invention, since the center light-emission wavelength is 610 nm and wavelength is broadbanded, excellent color purity and color rendition may be secured.

It seems that the technical features of the present invention are based on strong nephelauxetic effect of covalent bonding and crystal field splitting induced by insertion of nitrogen into crystals. However, since light-emission wavelength of an oxide-based SSO compound according to the comparative embodiment belongs to yellow visible ray region under 600 nm, compared to a SSON compound according to an embodiment of the present invention, light-emission intensity of the SSON compound (SSO compound?) at or above 600 nm is 40% or lower.

Furthermore, particularly in cases where temperatures for thermal treatment are 1,600° C. (curve T3) and 1,700° C. (curve T4), SSON compounds according to an embodiment of the present invention have the center light-emission wavelength at 610 nm regarding both an excitation light in near-ultraviolet ray region including 320 nm and 377 nm and an excitation light in blue visible ray region including 466 nm and may obtain high light-emission intensities (90% or higher) at 600 nm and 630 nm.

Therefore, a silicon oxynitride phosphor according to an embodiment of the present invention features red light-emission with high purity, and thus a white illumination apparatus with improved color rendition and low color temperature may be provided by using the same. Furthermore, since a phosphor according to an embodiment of the present invention exhibits high light-emission intensity, both color purity and brightness may be improved.

Figure 4:
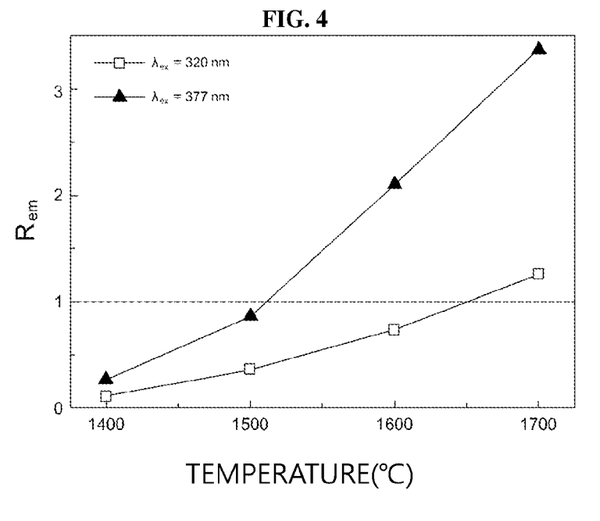
FIG. 4 is a graph showing a ratio ($R_{em}$) between a light-emission intensity of at 477 nm of a SSON compound and a light-emission intensity at 610 nm of the SSON compound based on change of a temperature for thermal treatment, when excitation wavelengths are 320 nm and 377 nm.

FIG. 4 is a graph showing a ratio ($R_{em}$) between a light-emission intensity of at 477 nm of a SSON compound and a light-emission intensity at 610 nm of the SSON compound based on change of a temperature for thermal treatment, when excitation wavelengths are 320 nm and 377 nm.

Referring to FIG. 4, as a temperature for thermal treatment of a SSON compounds increases (e.g., 1,400° C., 1,500° C., 1,600° C., and 1,700° C.), a ratio between the light-emission intensity at 610 nm with respect to the light-emission intensity at 477 nm ($I_{610}/I_{477}$) gradually increases. A SSON compound thermally treated in a temperature range from about 1,550° C. to about 1,800° C., which includes temperatures 1,600° C. and 1,700° C., exhibits a $R_{em}$ greater than 1. Particularly, when an excitation wavelength $\lambda_{ex}$ is 377 nm, light-emission intensity at 610 nm is more significant than light-emission intensity at 477 nm.

Furthermore, although not shown in FIG. 4, in case of an excitation based on a light having 466 nm wavelength, only single light-emission band is obtained in every sample. In other words, in case of a SSO compound, a light-emission peak appears only at 540 nm. In case of a SSON compound according to an embodiment of the present invention, a light-emission peak appears only at 610 nm and PLE spectrum covers up to 500 nm, the SSON compound may be applied as a red phosphor of a white LED using a blue light-emission chip.

Figure 5:
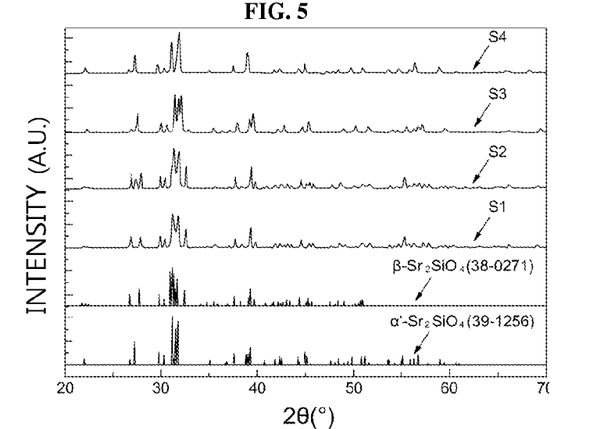
FIG. 5 is a graph showing results of X-ray diffraction analysis regarding samples of a SSON compound, a SMSON compound, a SCSON compound, and a SBSON compound, which are obtained via thermal treatments at 1,700° C., according to various embodiments of the present invention.

FIG. 5 is a graph showing results of X-ray diffraction analysis regarding samples of a SSON compound (curve S1), a SMSON compound (curve S2), a SCSON compound (curve S3), and a SBSON compound (curve S4), which are obtained via thermal treatments at 1,700° C., according to various embodiments of the present invention. For reference, results of X-ray diffraction analysis regarding $\beta$-$Sr_2SiO_4$ (#38-0271) and $\alpha'$-$Sr_2SiO_4$ (#39-1256) on the JCPDS card are also shown.

Referring to FIG. 5, the SSON compound (curve S1) has a pure $\beta$ phase identical to the SSON compound described above. Detailed description thereof is given above with reference to FIG. 2. However, as the SSON compound is doped with different metal atom M, phase transition occurs in the order of $\beta$ phase→$\alpha'$+$\beta$ mixed phase→$\alpha'$ phase. The phase transition depends on sizes of ions of the doped metal atom M, as shown in Table 2 below. Table 2 shows ion radius of doped metal ions of compounds $(Sr_{1.6}M_{0.4})Si(O_{1-x}N_x)_4$:$Eu^{2+}$ according to various embodiments of the present invention and light-emission spectrum characteristics based on the same.

TABLE 2

| | Ion Radius | Wavelengths in A-/B- bands in each $\lambda_{ext}$ | | | |
|---|---|---|---|---|---|
| M | (nm, CN = 9/10) | 320 nm | 337 nm | 466 nm** | Phase |
| Mg | 0.089 (CN = 8) | 478* | 477/530 | 604 | $\beta$ + $\alpha$ |
| Ca | 0.118/0.123 | 498/607 | 503/603 | 612 | $\alpha'$ |
| Sr | 0.131/0.136 | 477/606 | 477/602 | 610 | $\beta$ |
| Ba | 0.147/0.152 | 492/596 | 502/596 | 607 | $\alpha'$ |

*denotes A- band, whereas
**denotes B- band.

In Table 2, ion radius of Mg2+ having coordination numbers 9 and 10 could not be obtained, and thus ion radius of $Mg^{2+}$ having coordination number 8 is used as an alternative. It is expected that ions radius of $Ba^{2+}$ having coordination numbers 9 and 10 is significantly smaller than ion radius of $Ca^{2+}$ ions having coordination number 8 (ion radius is 0.112 nm). Ion radiuses satisfy the relationship Mg<Ca<Ba.

When a SSON compound having $\beta$ phase is doped with metal ions, $\alpha'$ phase begins to coexist with $\beta$ phase (e.g., a SMSON compound), and $\beta$ phase almost disappears later (e.g., a SCSON compound). Finally, in a SBSON compound, for example, only pure $\alpha'$ phase is obtained. Therefore, it is clear that M ions substituted in the SSON compound quenches and stabilizes $\alpha'$ phase even in the room temperature, thereby preventing $\alpha'$ phase (high temperature phase) from being transited to $\beta$ phase (low temperature phase). A ratio between Sr and the metal M (M/Sr) may be controlled based on fabricating process conditions including usage of a fusing agent, a temperature, and a process time. However, the present invention is not limited thereto.

According to an embodiment of the present invention, the SMSON compound (curve S2) has an almost same diffraction pattern as that of a mixture of $\beta$-$Sr_2SiO_4$ (#38-0271) and $\alpha'$-$Sr_2SiO_4$ (#39-1256). However, the SCSON compound (curve S3) and the SBSON compound (curve S4) have a same diffraction pattern as that of $\alpha'$-$Sr_2SiO_4$ (#39-1256). Furthermore, the SSON compound (curve S1) has an almost same diffraction pattern as that of $\beta$-$Sr_2SiO_4$ (#38-0271). Therefore, the curve S2 according to a second embodiment of the present invention. Therefore, it is clear that the curve S2 according to the second embodiment of the present invention has two phases including silicate-based phosphors $\beta$-$Sr_2SiO_4$ (#38-0271) and $\alpha'$-$Sr_2SiO_4$ (#39-1256). In case of the curves S3 and S4, it may be expected that the curves S3 and S4 have a same crystalline structure as that of $\alpha'$-$Sr_2SiO_4$ (#39-1256).

The reason of having crystalline structures from one another is based on size of ions. In other words, as size of ions increases (Mg<Ca<Ba), crystal phase of $\beta$-SSON gradually disappears and only $\alpha'$-phase remains at the end.

Figure 6:
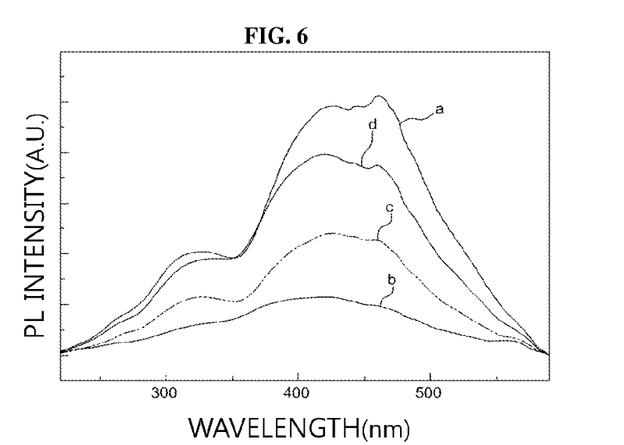
FIG. 6 shows PLE spectrums of a SSON compound, a SMSON compound, a SCSON compound, and a SBSON compound, which are thermally treated at 1,700° C., according to the second embodiment of the present invention.

FIG. 6 shows PLE spectrums of a SSON compound (curve a), a SMSON compound (curve b), a SCSON compound (curve c), and a SBSON compound (curve d), which are thermally treated at 1,700° C., according to the second embodiment of the present invention. Composition thereof is $(Sr_{1.6}M_{0.4})Si(O_{1-x}N_x)_4$:$Eu^{2+}$.

The PLE spectrums are measured in a wavelength range from about 200 nm to about 600 nm, which is from the ultraviolet ray region to a visible ray region. The above-stated compounds exhibit similar shapes and peak locations. However, excitation intensities thereof increases in the order of the SMSON compound<the SCSON compound<the SBSON compound<the SSON compound.

Figure 7A:
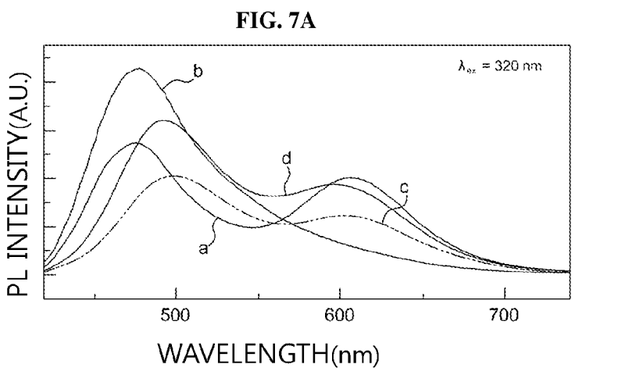
FIGS. 7A through 7C are light-emission spectrums of a SSON compound, a SCSON compound, and a SBSON compound according to an embodiment of the present invention, excited by light sources having wavelengths of 320 nm, 377 nm, and 466 nm, respectively.
Figure 7B:
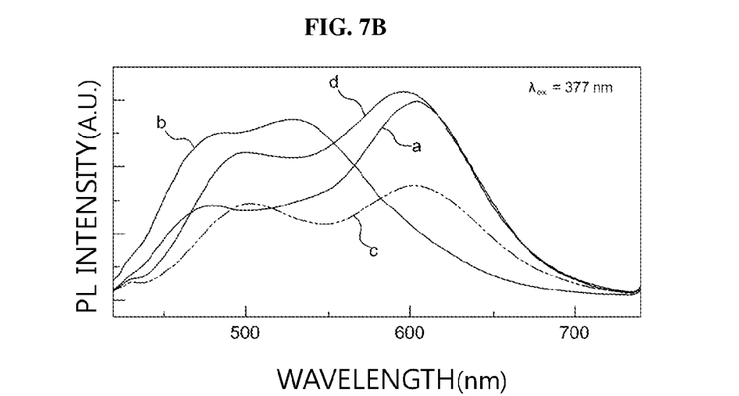
Figure 7C:
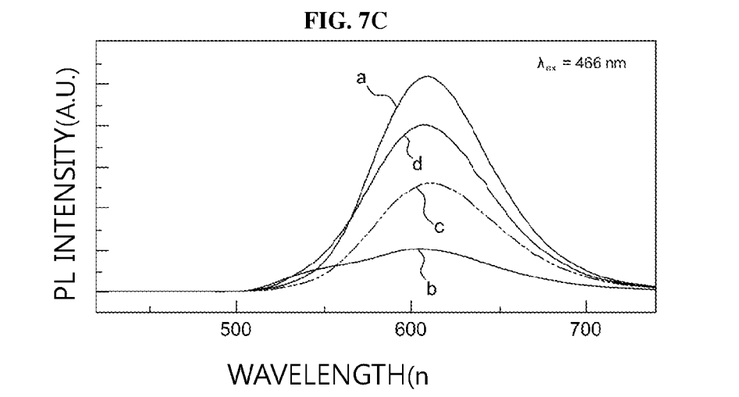

FIGS. 7A through 7C are light-emission spectrums of a SSON compound, a SCSON compound, and a SBSON compound according to an embodiment of the present invention, excited by light sources having wavelengths of 320 nm, 377 nm, and 466 nm, respectively.

Referring to FIGS. 7A through 7C, in case of being excited by excitation light sources having wavelengths of 320 nm and 377 nm, each of the SSON compound, the SCSON compound, and the SBSON compound according to an embodiment of the present invention has two light-emission bands in blue-green band (referred to hereinafter as A-band) and red band (referred to hereinafter as B-band). However, in case of being excited by a light source having 466 nm wavelength, only red light-emission characteristics are exhibited. Furthermore, wavelengths of main light-emission peaks of the SSON compound, the SCSON compound, and the SBSON compound varies based on ion radius of M2+.

Unlike the other embodiments, the SMSON compound (curve b) has only one asymmetrical band around 478 nm in case of being excited by a light source having 320 nm wavelength. However, the SSON compound has two light-emission bands around 477 nm and 530 nm in case of being excited by a light source having 377 nm wavelength. Therefore, nitrification is not effective for inducing red-shift of light-emission of Eu(II) in the SMSON compound, and thus only very weak red light-emission may be obtained in case of being excited by a light having 466 nm. The reason of the ineffectiveness of nitrification in a SMSON compound may be that the relatively small ion size of $Mg^{2+}$ offsets nitrification effect.

The graphs show that location of a peak is blue-shifted (shifted toward smaller wavelengths) in case of the B-band. The blue shift is based on size of M ions. Since $Ca^{2+}$<$Sr^{2+}$<$Ba^{2+}$, blue shift occurs in the order of SCSON->SSON->SBSON. As size of M ions increases, crystal field splitting of $Eu^{2+}$ ions at d level becomes smaller, and thus the lowest energy level at $Eu^{2+}$ 5d-site is shifted to larger energy.

From among compounds according to embodiments of the present invention, in case of the A-band, a SSON compound through a SCSON compound exhibit red shift in case of being excited by light sources having wavelengths of 320 nm and 377 nm, unlike the B-band. The reason thereof is that $Ca^{2+}$ ions are smaller than $Sr^{2+}$ ions. In the A-band, even though $Ba^{2+}$ ions are larger than $Sr^{2+}$ ions, a SSON compound through a SCSON compound exhibit red shift. The characteristic is explained by comparing change of spectrums in A-band and B-band based on size of M ions with crystal fields and covalent bondings at Eu(I)-site and Eu(II)-site.

Based on the results described above, a SSON compound, a SCSON compound, a SBSON compound, and a SMSON compound exhibit wide light-emission wavelength bands based on excitation wavelength nearby near-ultraviolet ray region, thus being very advantages for a while LED illumination. In other words, the SSON compound exhibits a wide light-emission band from blue region to red region, the SCSON compound and the SBSON compound exhibit wide light-emission bands from green region to red region, and the SMSON compound exhibits a wide light-emission band from blue region to red region.

Furthermore, according to an embodiment of the present invention, as Mg, Ba, or Ca is partially doped instead of Sr, a light-emission spectrum having a wide red wavelength band may be obtained by using a light source of ultraviolet ray region, near-ultraviolet ray region, or blue region (e.g., a LED). Therefore, in case of applying a silicon oxynitride phosphor to a white LED, a red phosphor capable of maximizing color connectivity may be obtained. Furthermore, a silicon oxynitride phosphor according to an embodiment of the present invention may tune red wavelength. If the metal M is Mg, a phosphor having a wide light-emission band from blue region to green region may be obtained by exciting the compound by using a near-ultraviolet ray LED. Furthermore, if the metal M is Ca or Ba, a phosphor having a wide light-emission band from green region to red region may be obtained by exciting the compound by using a near-ultraviolet ray region LED.

Figure 8:
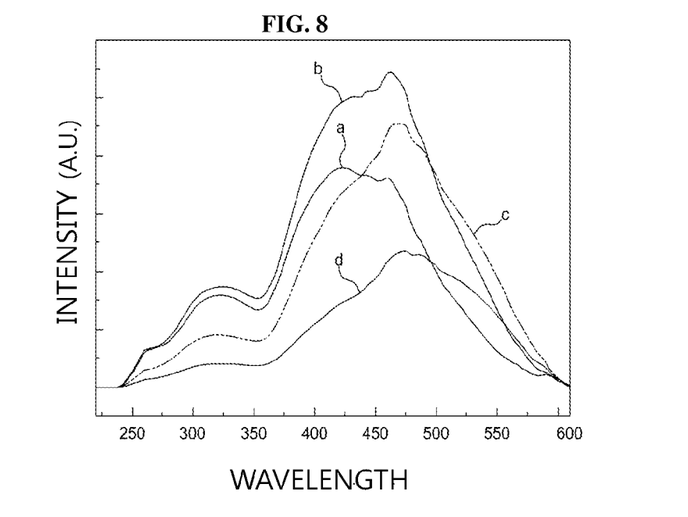
FIG. 8 is a graph showing excitation spectrums of SSON compounds with different Eu2+ concentrations, according to an embodiment of the present invention.

FIG. 8 is a graph showing excitation spectrums of SSON compounds with different $Eu^{2+}$ concentrations, according to an embodiment of the present invention. Curves a through d indicate results of measurements regarding SSON compounds with Eu2+ concentrations of 0.5 mol %, 1.0 mol %, 5 mol %, and 10 mol %.

Referring to FIG. 8, as $Eu^{2+}$ concentration is raised from 0.5 mol % to 1.0 mol %, intensity of excitation spectrum increases. However, when Eu2+ concentration increases to 5 mol %, intensity of excitation spectrum beings to decrease. When $Eu^{2+}$ concentration is 10 mol %, intensity of excitation spectrum rapidly decreases. Furthermore, as $Eu^{2+}$ concentration increases, a ratio between intensity of a light-emission peak at 466 nm with respect to intensity of a light-emission peak at 420 nm increases. Preferably, $Eu^{2+}$ concentration of a SSON compound may be from about 0.8 mol % to 3 mol %, where the highest excitation intensity is exhibited at 1.0 mol %. More preferably, the SSON compound may exhibit the maximum excitation intensity in a range from about 0.8 mol % to about 1.2 mol %. Based on obtained excitation spectrums, SSON compound powders according to an embodiment of the present invention may be applied as a red phosphor of a white LED using a near-ultraviolet ray region LED emitting a light having wavelength around 400 nm or a blue LED emitting a light having wavelength around 450 nm.

Figure 9:
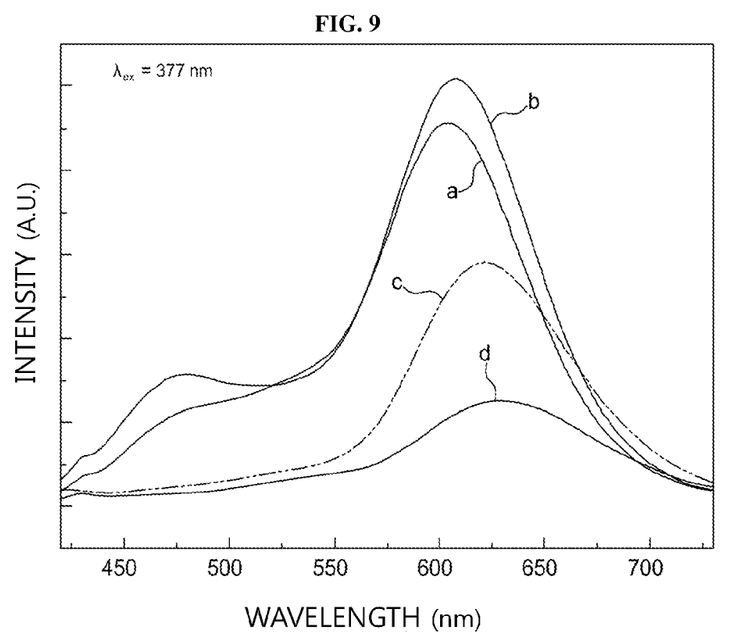
FIG. 9 is a graph showing light-emission spectrums of SSON compounds based on changes of Eu2+ concentration at excitation wavelength of 377 nm.

FIG. 9 is a graph showing light-emission spectrums of SSON compounds based on changes of $Eu^{2+}$ concentration at excitation wavelength of 377 nm. Curves a through d denote results of measurements regarding SSON compounds having Eu2+ concentrations of 0.5 mol %, 1.0 mol %, 5 mol %, and 10 mol %, respectively.

Referring to FIG. 9, according to an embodiment of the present invention, when being excited by a light having an excitation wavelength of 377 nm in near-ultraviolet ray region and $Eu^{2+}$ concentration is 1.0 mol % (curve b), the highest red light-emission intensity is shown around 608 nm. Furthermore, as Eu2+ concentration increases, peak moves toward longer wavelengths. Therefore, according to an embodiment of the present invention, a red light-emitting phosphor capable of controlling location of red light-emission peak may be obtained by controlling $Eu^{2+}$ concentration. In case of SSON compounds respectively having $Eu^{2+}$ concentrations of 0.5 mol % and 1.0 mol %, not only a red peak having a wide half width of a wide area, but also high light-emission intensities in the wide area from blue region to green region. Therefore, SSON compounds with $Eu^{2+}$ concentrations from about 0.4 mol % to about 1.2 mol %, which includes concentrations 0.5 mol % and 1.0 mol %, is very advantageous for color connectivity in case of being applied to a white LED using a near-ultraviolet ray LED.

Figure 10:
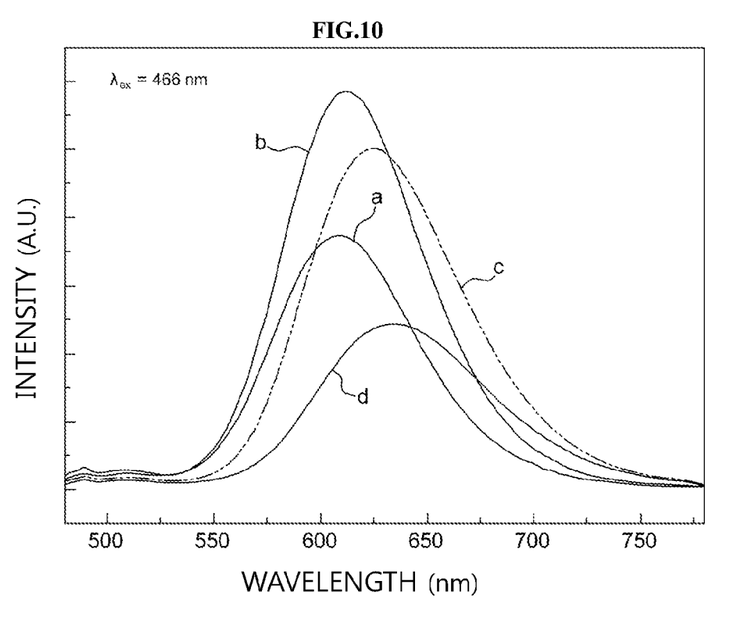
FIG. 10 is a graph showing light-emission spectrums of SSON compounds based on changes of Eu2+ concentration at excitation wavelength of 466 nm.

FIG. 10 is a graph showing light-emission spectrums of SSON compounds based on changes of $Eu^{2+}$ concentration at excitation wavelength of 466 nm. Curves a through d denote results of measurements regarding SSON compounds having Eu2+ concentrations of 0.5 mol %, 1.0 mol %, 5 mol %, and 10 mol %, respectively.

Referring to FIG. 10, when being excited by using a light having 466 nm wavelength in blue visible ray region, the SSON compound with $Eu^{2+}$ concentration of 1.0 mol % exhibits the highest red light-emission intensity around 613 nm. As $Eu^{2+}$ concentration increases, peak moves toward longer wavelengths. For example, the SSON compound (curve d) with $Eu^{2+}$ concentration of 10 mol % exhibits red light-emission at about 635 nm. According to an embodiment of the present invention, by controlling $Eu^{2+}$ concentration, a red light-emission peak with a wide half width may be obtained and location of a red light-emission peak may be controlled. Therefore, a SSON compound according to an embodiment of the present invention may be used as a red phosphor for a white LED using a blue LED, and, due to large half width of a peak, the SSON compound may improve color connectivity of the white LED.

Figure 11:
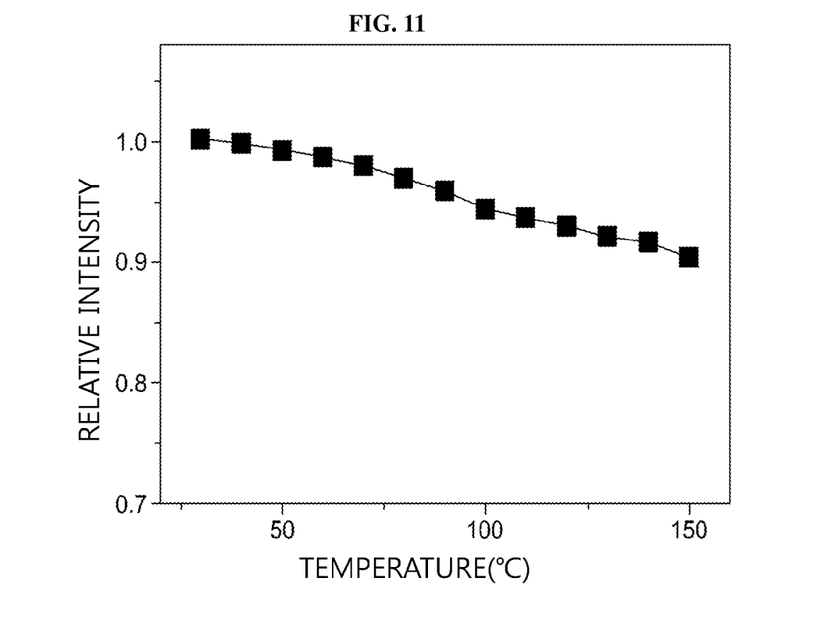
FIG. 11 is a graph showing change of red light-emission intensity based on change of temperature of a SSON compound according to an embodiment of the present invention.

FIG. 11 is a graph showing change of red light-emission intensity based on change of temperature of a SSON compound according to an embodiment of the present invention.

Referring to FIG. 11, according to an embodiment of the present invention, when being excited by a light having wavelength of 466 nm in blue visible ray region, light-emission intensity of the SSON compound gradually decreases as compared to the initial light-emission intensity as temperature increases. The SSON compound maintains about 90% light-emission intensity at about 150° C., compared to the initial light-emission intensity. Therefore, according to an embodiment of the present invention, $Sr_2Si(O_{1-x}N_x)_4:Eu^{2+}$ powders are suitable as red phosphor for a high power white LED.

Although the above embodiments described with reference to FIGS. 8 through 11 relate to SSON compounds, similar characteristics are expected from a SMSON compound, a SCSON compound, or a SBSON compound formed by partially substituting Sr atoms with Mg, Ca, Ba, or a combination thereof. In terms of brightness characteristics based on temperature, the above-stated compounds are barely affected by substitution of MG, Ca, or Ba and exhibit similar characteristics as a SSON compound.

Figure 12:
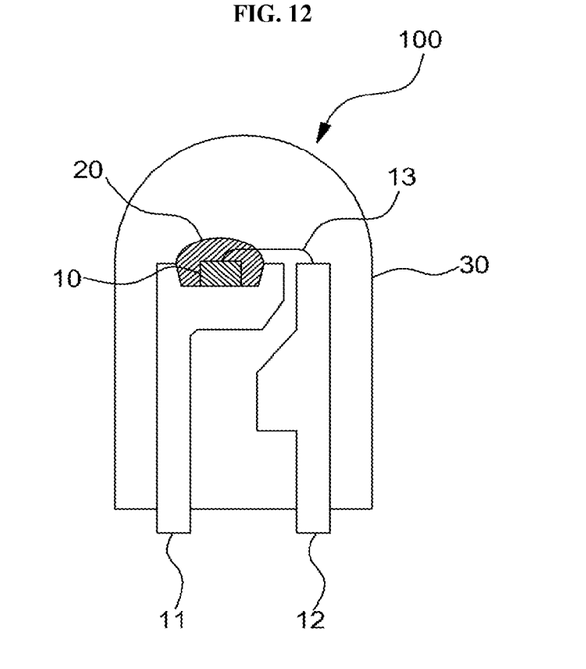
FIG. 12 is a schematic sectional view of a capsule-type illumination device 100 according to an embodiment of the present invention.

FIG. 12 is a schematic sectional view of a capsule-type illumination device 100 according to an embodiment of the present invention.

Referring to FIG. 12, the illumination device 100 includes a light source 10, which emits a light, and a phosphor layer 20, which is arranged at an optical path of the light source 10, is excited by a light, and emits a light. The light source 10 may be a semiconductor diode capable of emitting a light during recombination based on PN junction of a semiconductor. The semiconductor diode may be a UV LED capable of emitting a light in near-ultraviolet ray region or a blue LED capable of emitting a light in blue visible ray region. The phosphor layer 20 may include a red light-emission phosphor according to the above-stated embodiments of the present invention. The red light-emission phosphor may be distributed in the phosphor layer 20 to have a designated particle size distribution.

The illumination device 100 may further include leads 11 and 12 for supplying power to the light source 10 and a wire 13 for electrically interconnecting the lead 12 and the light source 10. The light source 10, the leads 11 and 12, and the wire 13 may be sealed in a cannonball-like shape by a suitable sealing member 30, such as a phototransmissive resin, rubber, or glass.

The shell-type illumination device 100 shown in FIG. 12 is merely an example, and the present invention is not limited thereto. For example, a illumination device may be provided as a chip-type known in the art, in which the illumination device is formed on a substrate including a recessed unit with open top. Alternatively, a reflection-type illumination device, in which a light source and a phosphor layer may be arranged apart from each other and a light emitted by the phosphor layer is guided to a reflection plate, may be embodied. For another example, a phosphor layer may be arranged on a sealing member, and the phosphor layer may be sealed again.

The illumination device 100 may be a white diode lamp, for example. A white light may be embodied as a part of a light emitted by the light source 10 and a wavelength-converted light emitted by a red phosphor excited in the phosphor layer 20 are mixed with each other. Selectively, the phosphor layer 20 may further include a green light-emission phosphor, together with the red light-emission phosphor. To embody a white light, the light source 10 may be a blue LED. The blue LED may be an InGaN-based diode, for example.

As another configuration for embodying a white light, a UV LED capable of emitting an excitation light in near-ultraviolet ray region may be applied. In this case, as a light-emitter for visible rays, not only a red phosphor, but also light-emission phosphor of other colors, e.g., a mixture of a green phosphor and a blue phosphor in a designated composition ratio, may be used.

The illumination device 100 may be used as an illumination device or a display device. Alternatively, the illumination device 100 may be applied to a backlight unit of a display device, such as a liquid crystal display device. However, the present invention is not limited thereto.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. A silicon oxynitride phosphor comprising a compound indicated by Formula 1 below, $$Sr_{2-z}Si(O_{1-x}N_x)_4:zEu^{2+}, \text{ wherein } 0<x<1 \text{ and } 0<z\le0.4, \quad \text{[Formula 1]}$$

wherein a light is irradiated to the silicon oxynitride phosphor, and the silicon oxynitride phosphors emits light.

2. The silicon oxynitride phosphor of claim 1, wherein a phosphor of the silicon oxynitride phosphor is a red light-emission phosphor.

3. The silicon oxynitride phosphor of claim 1, wherein light-emission peaks of the red light-emission phosphor comprise the main light-emission peak at 610 nm.

4. The silicon oxynitride phosphor of claim 3, wherein light-emission peaks of the red light-emission phosphor comprise a light-emission peak at 477 nm.

5. The silicon oxynitride phosphor of claim 1, wherein the excitation light source comprises ultraviolet rays in a range from 300 nm to 330 nm, near-ultraviolet rays in a range from 470 nm to 410 nm, and blue visible rays in a range from 450 nm to 470 nm.

6. The silicon oxynitride phosphor of claim 1, wherein the silicon oxynitride phosphor has a crystalline structure of $\beta$-$Sr_2SiO_4$.

7. The silicon oxynitride phosphor of claim 1, wherein z satisfies $0.016 \le z \le 0.06$.

8. A silicon oxynitride phosphor comprising a compound indicated by Formula 2 below, $$Sr_{2-y-z}M_ySi(O_{1-x}N_x)_4:zEu^{2+}, \text{ wherein M is Ca, Ba, Mg, or a combination thereof,} \quad \text{[Formula 2]}$$

wherein $0<x<1$, $0<y<2$, $0<z\le0.4$, $0<y+z<2$, a light is irradiated to the silicon oxynitride phosphor, and the silicon oxynitride phosphors emits light.

9. The silicon oxynitride phosphor of claim 8, wherein a phosphor of the silicon oxynitride phosphor is a red light-emission phosphor.

10. The silicon oxynitride phosphor of claim 8, wherein the silicon oxynitride phosphor has light-emission bands in both blue-green region and red region.

11. The silicon oxynitride phosphor of claim 8, wherein the excitation light source comprises ultraviolet rays in a range from 300 nm to 330 nm, near-ultraviolet rays in a range from 470 nm to 410 nm, and blue visible rays in a range from 450 nm to 470 nm.

12. The silicon oxynitride phosphor of claim 8, wherein the silicon oxynitride phosphor has a crystalline structure of $\alpha'$-$Sr_2SiO_4$.

13. The silicon oxynitride phosphor of claim 8, wherein, in Formula 2, M is Mg, and the silicon oxynitride phosphor is excited by a near-ultraviolet ray LED and has a light-emission spectrum in a wide band from blue region to green region.

14. The silicon oxynitride phosphor of claim 8, wherein, in Formula 2, M is Ca or Ba, and the silicon oxynitride phosphor is excited by a near-ultraviolet ray LED and has a light-emission spectrum in a wide band from green region to red region.

15. The silicon oxynitride phosphor of claim 8, wherein z satisfies $0.016 \le z \le 0.06$.

16. A method of fabricating a silicon oxynitride phosphor comprising:

mixing precursor compositions indicated by chemical formulae $SrCO_3$, $Si_3N_4$, and $Eu_2O_3$; and forming a compound indicated by Formula 1 below by thermally treating the mixture:

$$Sr_{2-z}Si(O_{1-x}N_x)_4:zEu^{2+}, \text{ wherein } 0<x<1 \text{ and } 0<z\le0.4. \quad \text{[Formula 1]}$$

17. The method of claim 16, wherein the thermal treatment is performed in nitrogen atmosphere.

18. The method of claim 16, wherein the thermal treatment is performed at a temperature from 1,650° C. to 1,800° C.

19. A method of fabricating a silicon oxynitride phosphor comprising:

mixing precursor compositions indicated by chemical formulae $SrCO_3$, $Si_3N_4$, and $Eu_2O_3$ with an oxide, a nitride, a oxynitride, a carbonate, a hydroxide, or a chloride of a metal M; and forming a compound indicated by Formula 2 below by thermally treating the mixture:

$$Sr_{2-y-z}M_ySi(O_{1-x}N_x)_4:zEu^{2+}, \text{ wherein M is Ca, Ba, Mg, or a combination thereof,} \quad \text{[Formula 2]}$$

wherein $0<x<1$, $0<y<2$, $0<z\leq0.4$, $0<y+z<2$.

20. The method of claim 19, wherein the thermal treatment is performed in nitrogen atmosphere.

21. The method of claim 19, wherein the thermal treatment is performed at a temperature from 1,650° C. to 1,800° C.

22. An optical device comprising:
   an excitation light source, which emits a light in at least one from among near-ultraviolet ray region, ultraviolet ray region, and blue region; and
   a phosphor of any of claims 1 through 13, which is arranged at an optical path of the excitation light source, is excited by the light, and emits a light.

23. The optical device of claim 22, wherein the optical device is one from among a light-emitting device, an illumination device, and a display device.

* * * * *